United States Patent [19]
Sato et al.

[11] Patent Number: 5,830,280
[45] Date of Patent: Nov. 3, 1998

[54] WASHING LIQUID FOR POST-POLISHING AND POLISHING-CLEANING METHOD IN SEMICONDUCTOR PROCESS

[75] Inventors: Yoshihide Sato, Hiratsuka; Takayuki Komiya, Kofu; Hiroki Ohno, Nirasaki, all of Japan

[73] Assignee: Tokyo Electron Limited, Tokyo, Japan

[21] Appl. No.: 818,724

[22] Filed: Mar. 14, 1997

[30] Foreign Application Priority Data

Mar. 15, 1996 [JP] Japan ................................ 8-087233

[51] Int. Cl.[6] .................................................. C03C 23/00
[52] U.S. Cl. .................................. 134/2; 134/3; 134/32; 134/33; 134/26; 134/28
[58] Field of Search .................. 134/2, 1.3, 1, 26, 134/28, 32, 3, 33

[56] References Cited

U.S. PATENT DOCUMENTS

| | | | |
|---|---|---|---|
| 3,979,241 | 9/1976 | Maeda et al. | 438/637 |
| 4,087,367 | 5/1978 | Rioult et al. | 252/79.1 |
| 4,181,623 | 1/1980 | Dillarstone et al. | 510/182 |
| 4,569,722 | 2/1986 | Maury et al. | 216/99 |
| 4,795,582 | 1/1989 | Ohmi et al. | 252/79.3 |
| 5,219,791 | 6/1993 | Freiberger | 438/640 |
| 5,277,835 | 1/1994 | Ohmi et al. | 252/79.3 |
| 5,320,709 | 6/1994 | Bowden et al. | 438/745 |
| 5,376,236 | 12/1994 | Hanson et al. | 216/108 |
| 5,409,544 | 4/1995 | Ota et al. | 134/22.14 |
| 5,421,906 | 6/1995 | Borah | 134/26 |
| 5,478,436 | 12/1995 | Winebarger et al. | 438/693 |

FOREIGN PATENT DOCUMENTS

| | | |
|---|---|---|
| 59-31029 | 2/1984 | Japan. |
| 60-43831 | 3/1985 | Japan. |
| 1-125831 | 5/1989 | Japan. |

Primary Examiner—Harold Y. Pyon
Assistant Examiner—Alexander Markoff
Attorney, Agent, or Firm—Oblon, Spivak, McClelland, Maier & Neustadt, P.C.

[57] ABSTRACT

A polishing treatment called CMP (chemical mechanical polishing) is utilized for filling a contact hole formed in a silicon oxide film with a metallic layer in a manufacturing process of a semiconductor device. After a CMP treatment, a target surface, on which the silicon oxide film and the metallic layer are exposed, is washed with a washing liquid so as to remove residues due to the CMP treatment. The washing liquid comprises a fluorine compound for providing an etchant for the silicon oxide film and the metallic layer, and a protective agent which can be adhered onto a surface of the metallic layer so as to form a protective film. The ratio between the fluorine compound and the protective agent is set such that etching rates of the silicon oxide film and the metallic layer to be effected by the washing liquid fall within ranges of from 0.5 nm/min to 5 nm/min and from 0.5 nm/min to 6 nm/min, respectively, and a ratio between these etching rates falls within a range of from "2:1" to "1:3".

10 Claims, 3 Drawing Sheets

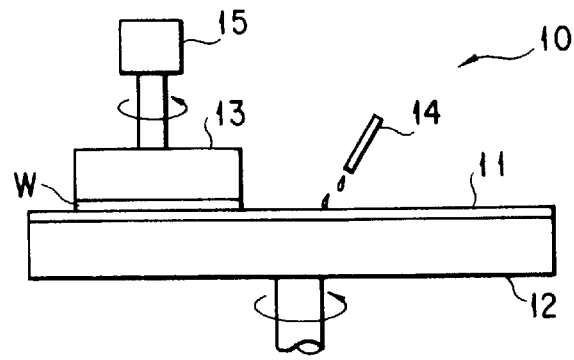
F I G. 2A
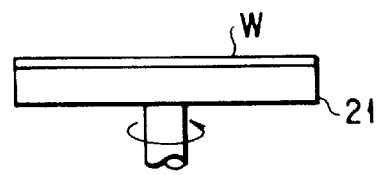
F I G. 2B
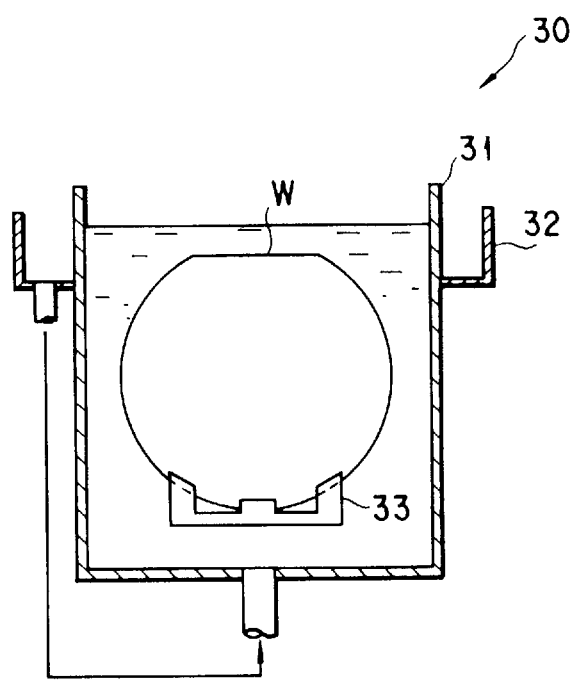
F I G. 2C

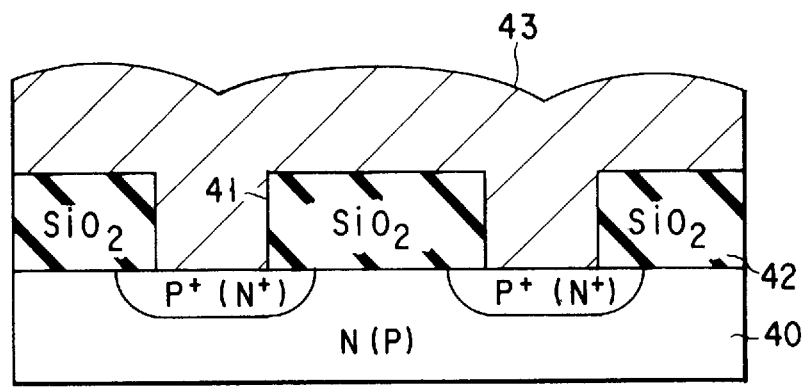
F I G. 3A
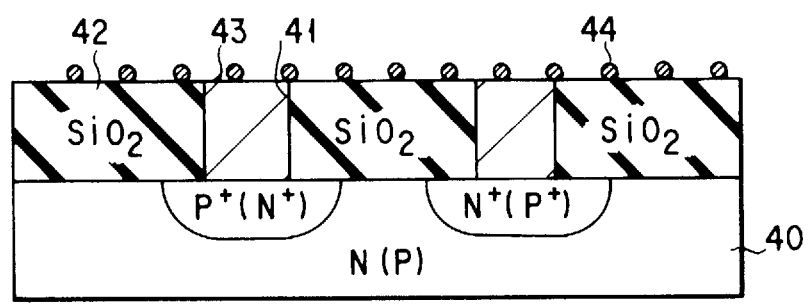
F I G. 3B
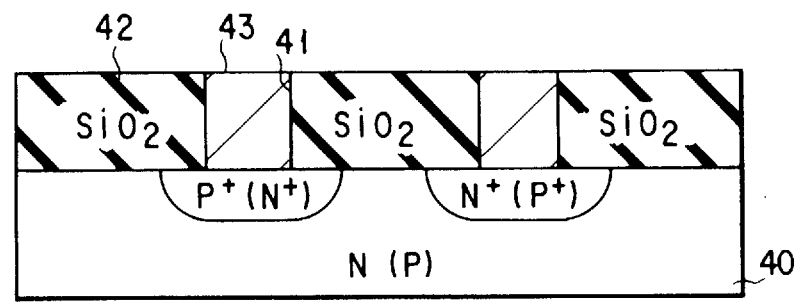
F I G. 3C

WASHING LIQUID FOR POST-POLISHING AND POLISHING-CLEANING METHOD IN SEMICONDUCTOR PROCESS

BACKGROUND OF THE INVENTION

This invention relates to a washing liquid for removing residues from the surface of a substrate after a polishing treatment which exposes a layer consisting essentially of a silicon oxide-base material such as $SiO_2$ insulating film as well as a layer consisting essentially of a material having metallic properties such as a metallic wiring layer, in a semiconductor process. This invention also relates to a polishing-cleaning method using the aforementioned washing liquid. The expression, "semiconductor process" described hereinafter means a process for forming a semiconductor device on a substrate such as a semiconductor wafer and an LCD substrate.

A treatment called etch-back is commonly employed for forming wirings or electrodes of a semiconductor device. For example, this etch-back is performed for burying a metallic layer consisting of a wiring material such as W (tungsten) or Al (aluminum) in a contact hole formed in an insulating film such as a silicon oxide film, etc. More specifically, first of all, a metallic film consisting of a wiring material is formed all over the surface of a semiconductor wafer having thereon an insulating film with a contact hole formed therein in advance. Then, an etch-back is performed to remove the metallic film until the insulating film and part of the metallic film buried in the contact hole are exposed.

This etch-back is conventionally performed by making use of a dry etching. However, it has been recently studied to make use of a polishing treatment called CMP (chemical mechanical polishing) in place of the dry etching.

According to this CMP method, a polishing cloth made of polyurethane for instance and attached to a rotary table, and an abrasive material comprising silica ($SiO_2$) as main component are employed to polish a surface of a substrate such as a semiconductor wafer, etc. In the CMP, a synergistic effect by chemical and physical mechanisms is assumed to be related to a large extent to the polishing mechanism thereof.

This CMP is advantageous in that, if it is utilized for a surface treatment corresponding to the etch-back in place of dry etching, the surface thus treated is much excellent in smoothness as compared with that to be obtained by the dry etching. However, when a surface treatment is performed by means of the CMP, the surface thus treated is soiled with residues such as wastes from polishing or reaction products, so that the treated surface is required to be cleaned after the CMP treatment. This cleaning of the surface after this polishing treatment has to be carried out so as to completely remove the residues but not to badly affect the features of the treated surface. However, a washing liquid or method meeting such requirements has not yet been established so far, for a cleaning treatment performed after the CMP.

BRIEF SUMMARY OF THE INVENTION

Accordingly, an object of the present invention is to provide a washing liquid which is capable of completely removing residues from the surface of a substrate without badly affecting the features of the surface of the substrate, which has been polished in a polishing treatment to expose a layer consisting essentially of a silicon oxide-base material and a layer consisting essentially of a material having metallic properties, in a semiconductor process.

Another object of this invention is to provide a polishing-cleaning method, which employs such a washing liquid as mentioned above.

Namely, according to a first aspect of the this invention, there is provided a washing liquid for removing residues from a target surface of a substrate which has been polished to expose a first layer consisting essentially of a silicon oxide-base material and a second layer consisting essentially of a material having metallic properties, in a semiconductor process, the washing liquid comprising:

a fluorine compound for providing an etchant for the first layer and the second layer; and a protective agent which can be adhered onto a surface of the second layer so as to form a protective film, wherein a ratio between the fluorine compound and the protective agent being set such that etching rates of the first layer and the second layer to be effected by the washing liquid fall within ranges of from 0.5 nm/min to 5 nm/min and from 0.5 nm/min to 6 nm/min, respectively, and a ratio between these etching rates falls within a range of from "2:1" to "1:3".

According to a second aspect of the this invention, there is provided a method of polishing and cleaning a target surface of a substrate provided thereon with a first layer consisting essentially of a silicon oxide-base material and having a hole formed therein, and a second layer consisting essentially of a material having metallic properties and covering the first layer while filling the hole, the method comprising:

a polishing step of polishing flatly the second layer until the first layer and part of the second layer filling the hole are exposed;

a washing step of washing the target surface with the washing liquid so as to remove residues left after the polishing step;

a rinsing step of rinsing the target surface with a rinsing solution after the washing step; and a drying step of drying the target surface after the rinsing step.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2C represent a CMP apparatus, a spin drying apparatus and a washing apparatus, respectively, which are employed in the embodiment shown in FIG. 1;

FIGS. 3A to 3C are cross-sectional views, each illustrating a structure of the target surface of a wafer which has been treated according to the embodiment shown in FIG. 1.

DETAILED DESCRIPTION OF THE INVENTION

Figure 4:
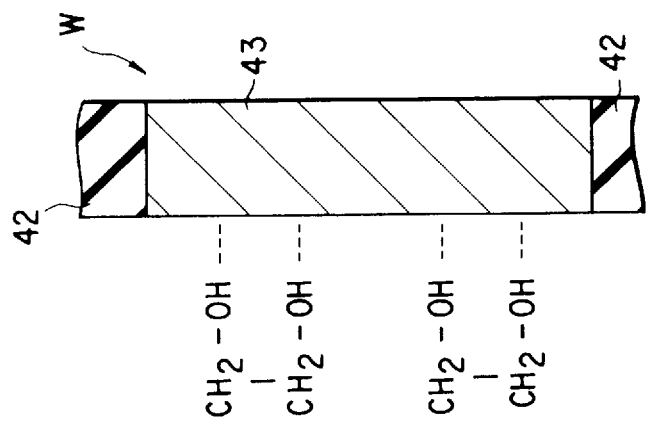
FIG. 4 is a schematic view illustrating a manner wherein an organic solvent adheres to a metallic layer on a target surface.

The washing liquid according to this invention is intended to be used for washing a surface of a substrate, which has been polished to expose a first layer consisting essentially of a silicon oxide-base material and a second layer consisting essentially of a material having metallic properties. A typical example of the first layer is silicon oxide represented by $SiO_2$. On the other hand, a typical example of the second layer is a material which is commonly employed as a wiring material for a semiconductor device, such as Al, Cu, Si, W, Ti, Mo or an alloy comprising any of these elements.

The basic mechanism of this invention resides in that not only the residues on the surface to be treated are washed away by a washing liquid, but also the surfaces of the first and second layers are slightly etched by the washing liquid so as to be washed away together with the residues on the these surfaces. Accordingly, the washing liquid contains a fluorine compound for providing an etchant not only for a first layer consisting essentially of a silicon oxide-base material, but also for a second layer consisting essentially of a material having metallic properties.

Generally speaking however, the aforementioned wiring materials having metallic properties are more vulnerable to corrosion by the fluorine compound as compared with the silicon oxide-based material. In other words, the aforementioned second layer will be etched away at a far higher rate by an etchant provided by the fluorine compound than the first layer. If this difference in etching rate between the first layer and the second layer is too large in a process of washing, the features of the resultant surface polished in this manner would be deteriorate.

Taking these problems into consideration, the washing liquid according to this invention is prepared to contain a protective agent which is capable of being adhered onto a surface of the second layer consisting essentially of a material having metallic properties so as to form a protective film thereon, thereby suppressing the preferential etching of the second layer. In this case, the ratio between the fluorine compound and the protective agent in the washing liquid is set such that the etching rates of the first layer and the second layer that will be attained by the washing liquid fall within ranges of from 0.5 nm/min to 5 nm/min and preferably from 1 nm/min to 3 nm/min, and from 0.5 nm/min to 6 nm/min and preferably from 1 nm/min to 4 nm/min, respectively, and a ratio between these etching rates falls within a range of from "2:1" to "1:3" and preferably from "1:1" to "2:3".

The target surface of a substrate that will be treated by means of a polishing-cleaning method according to this invention by making use of the aforementioned washing liquid is provided thereon with a first layer consisting essentially of a silicon oxide-base material and having a hole formed therein, and a second layer consisting essentially of a material having metallic properties and covering the first layer, the hole being buried with the second layer. As mentioned above, a typical example of the first layer is a silicon oxide represented by $SiO_2$. On the other hand, a typical example of the second layer is a material which is commonly employed as a wiring material for a semiconductor device, such as Al, Cu, Si, W, Ti, Mo or an alloy comprising any of these elements.

According to the polishing-cleaning method of this invention, the second layer is flatly polished until the first layer and that part of the second layer which is buried in the hole are exposed. Then, the target surface of the substrate is washed with the aforementioned washing liquid so as to remove residues from the polished surface after the polishing treatment.

The washing liquid and the polishing-cleaning method according to this invention will be further explained in detail with reference to the following embodiments.

Figure 1:
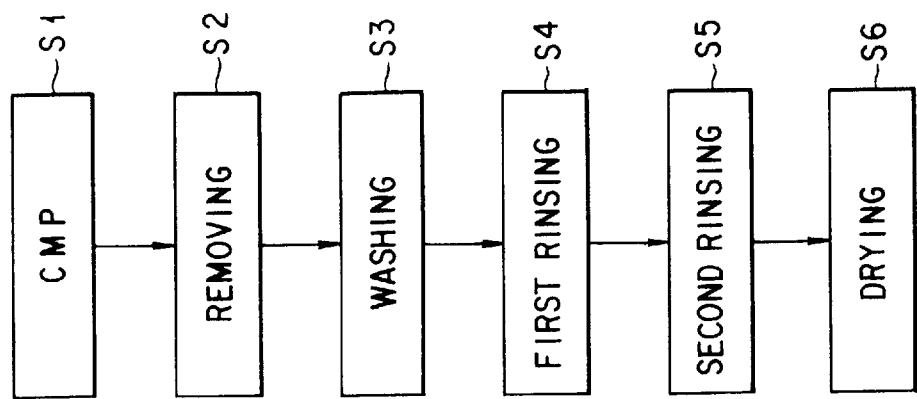
FIG. 1 is a flowchart illustrating a polishing-cleaning method according to one embodiment of this invention.

FIG. 1 is a flowchart illustrating a polishing-cleaning method according to one embodiment of this invention, making use of the CMP (chemical mechanical polishing). This embodiment illustrates a polishing-cleaning method for burying a contact hole with a wiring material in a manufacturing process of a semiconductor device.

As shown in FIG. 1, the polishing-cleaning method according to this embodiment comprises a sequence of six steps, i.e. a CMP step (S1), a removing step (S2), a washing step (S3), a first rinsing step (S4), a second rinsing step (S5) and a drying step (S6).

The CMP step (S1) is a step of performing the CMP, which can be carried out by making use of CMP apparatus 10 shown in FIG. 2A for instance. This CMP apparatus 10 is mainly constituted by a rotary table 12 having a flat surface which is covered with a polishing cloth 11 and kept in the horizontal state, a rotatable holder 13 for horizontally holding a wafer W, i.e. a target substrate, and a motor 15 for rotating the holder 13.

During the polishing, the wafer W is attached to the holder 13 such that the target surface thereof is turned downward. Then, the target surface of the wafer W is pressed in parallel onto the polishing cloth 11 while rotating the table 12 and the holder 13 around their axes. At this moment, a polishing solution is supplied from a polishing solution supply nozzle 14 to the surface of the polishing cloth 11. In this manner, the wafer W itself is rotated about its axis while revolving around the axis of the polishing cloth 11 so as to flatly polish the target surface of the wafer W with the polishing cloth 11.

FIG. 3A represents a cross-sectional view of the structure of the target surface of wafer W before it is polished. Referring to FIG. 3A, a silicon oxide film 42 is formed on the surface of an N-type or P-type silicon substrate or layer 40. A contact hole 41 having a width of 0.85 μm for instance is formed in this silicon oxide film 42. A metallic layer 43 consisting of W (tungsten) is formed so as to cover the entire surface of the silicon oxide film 42 and to fill the contact hole 41 with the metallic layer 43.

When the wafer W constructed in this manner is polished by means of the CMP apparatus, the metallic layer 43 is polished due to a friction between the metallic layer 43 on the wafer W and the polishing cloth 11 and between the metallic layer 43 and the polishing liquid, and due to a chemical reaction under this frictional heat, between the components of the polishing liquid and the metallic layer 43. This flat polishing of the metallic layer 43 to remove an unnecessary part of the metallic layer 43 is continued until the silicon oxide film 42 as well as that part of the metallic layer 43 which is buried in the contact hole 41 are exposed. When this CMP step S1 is finished, the surface of the wafer W is soiled as a result of this polishing with residues 44 such as cut wastes of the metallic layer 43 and reaction products of the CMP as shown in FIG. 3B.

Then, a removing step (S2) for removing water from the target surface of the wafer W is performed. This step is carried out by fixing the wafer W through suction onto the surface of the rotary table 21 and rotating the rotary table 21 at a high speed, as shown in FIG. 2B. As a result, the water adhered onto the wafer W flies away with the effect of centrifugal force, thereby drying the target surface of the wafer W.

The reason for conducting this removing step S2 prior to the washing step S3 is that if the washing of wafer W is performed without removing water, the composition of the washing liquid, in particular the content of water in the washing liquid, is changed, resulting in a fluctuation in etching rates of the silicon oxide film and of the metallic layer to be effected by the washing liquid, thus making it impossible to accurately control the washing treatment.

Then, the washing step S3 is performed for removing residues 44 from the target surface of the wafer W by making use of a washing liquid. This washing step S3 can be carried out by employing a washing apparatus 30 as shown in FIG. 2C for instance.

This washing apparatus 30 comprises an inner tank 31 filled therein with a washing liquid for immersing the wafer W, and an outer tank 32 disposed along the outer periphery of the upper edge of the inner tank 31. A holder 33 for holding a plurality of wafers W is disposed inside the inner tank 31. Any part of washing liquid overflowing from the inner tank 31 is received and then circulated to the bottom of the inner tank 31.

During the washing, a washing liquid is supplied to the washing apparatus 30, thus allowing a stream of the washing liquid to be formed in the inner tank 31, and at the same time a plurality of wafers W mounted on the holder 33 are immersed in the washing liquid for 3 to 10 minutes for instance. In this washing step, not only the residues 44 on the target surface are washed away by the washing liquid, but also the surfaces of the silicon oxide film 42 and the metallic layer 43 are slightly etched by the washing liquid so as to be washed away together with the residues 44 on the these surfaces.

For this purpose, the washing liquid contains a fluorine compound for providing an etchant not only for the silicon oxide film 42 but also for the metallic layer 43. Further, in order to inhibit an excessive preferential etching of the metallic layer 43 by the washing liquid, the washing liquid is prepared to contain a protective agent which is capable of being adhered onto the surface of the metallic layer 43 so as to form a protective film thereon. In this case, the ratio between the fluorine compound and the protective agent in the washing liquid is set, as mentioned above, such that the etching rates of the silicon oxide film 42 and the metallic layer 43 that will be attained by the washing liquid fall within ranges of from 0.5 nm/min to 5 nm/min and preferably from 1 nm/min to 3 nm/min, and from 0.5 nm/min to 6 nm/min and preferably from 1 nm/min to 4 nm/min, respectively, and a ratio between these etching rates falls within a range of from "2:1" to "1:3" and preferably from "1:1" to "2:3".

More specifically, the washing liquid can be prepared by mixing an aqueous solution of fluorine compound, i.e. a fluorine compound solution with a solution of a protective agent in an organic solvent, i.e. a protective solution. However, if the protective agent is an organic solvent, the washing liquid can be prepared by simply mixing an aqueous solution of fluorine compound with such an organic solvent functioning also as a protective agent.

As for the fluorine compound solution, an aqueous solution of ammonium fluoride ($NH_4F$), hydrofluoric acid (HF), or a buffered hydrofluoric acid (BHF) comprising $NH_4F$ and HF can be employed.

As for the protective agent, a surfactant such as ethylene glycol, a polyhydric alcohol, ketone, ether, phenol or saccharides, preferably a nonionic surface active agent such as catechol can be employed. As for the organic solvent to be used for the protective agent, dimethyl sulfoxide can be employed. Ethylene glycol and polyhydric alcohols are organic solvents which are useful as the protective agent.

One optimum example of the washing liquid which is most suited for washing the target surface for exposing a silicon oxide film as well as a tungsten metal layer is a mixed solution comprising a BHF as a fluorine compound which is formed of a mixture of a 40% aqueous solution of $NH_4F$ and a 50% aqueous solution of HF, the mixing ratio thereof being 50:1, and ethylene glycol as a protective agent functioning also as a solvent, the mixing ratio between the BHF and ethylene glycol being 1:4. It has been found that when a wafer W is immersed for about 2 minutes in the washing solution prepared in this manner and heated to a temperature of about 25° C. by making use of the washing apparatus 30 shown in FIG. 2C, it is possible to effectively remove the residues left after the polishing step without badly affecting the features of the target surface.

During this washing treatment of the target surface, the surfaces of the silicon oxide film 42 and the metallic layer 43 are slightly etched by the washing liquid so as to be washed away together with the residues 44 on the these surfaces. In this case, the hydroxyl group of the ethylene glycol is electrically adhered onto the surface of the metallic layer 44 of the wafer W as shown in FIG. 4, so that a protective layer induced by the protective agent is formed on the surface of the metallic layer 44. This protective film functions to inhibit an excessive preferential etching of the metallic layer 43 by the washing liquid, more specifically by the fluorine in the washing liquid.

It is preferable for the purpose of forming a protective film with a protective agent on the surface of the metallic layer 43 to select a protective agent having two or more hydroxyl groups. If this protective agent contains two or more hydroxyl groups in its molecule, the protective agent can be adhered via these hydroxyl groups onto the surface of the metallic layer 43 so that the adsorption of protective agent becomes more stable, thereby facilitating the formation of a protective film. By contrast, if the protective agent contains only one hydroxyl groups in its molecule, the adsorbability of the protective agent would be weak and unstable so that the formation of protective film becomes more difficult. Since hydroxyl group has an inclination to selectively adhere onto the surface of the pure metallic layer 43, there is little possibility of hydroxyl group being adhered on the surface of the silicon oxide film 42 or the residues 44.

By performing the washing step in the manner as mentioned above, it is possible to remove the residues 44 on the surface of the wafer W while suppressing an excessive preferential etching or corrosion of the surface of the metallic layer 43, i.e. enabling a uniform etching of the silicon oxide film 42 and the metallic layer 43 to be performed as shown in FIG. 3C. It is of course possible to control the etching rate of the surface of the wafer W in this washing step employing the aforementioned washing liquid by changing the mixing ratio between ethylene glycol and the BHF or by changing the composition of the BHF.

Upon finishing the washing step S3, the first rinsing step S4 and the second rinsing step A5 are performed. These first and second rinsing steps can be carried out by making use of a rinsing apparatus having almost the same structure as that of washing apparatus 30 for instance. Namely, in the step of rinsing, a rinsing liquid is supplied to the rinsing apparatus, thus allowing a stream of the rinsing liquid to be formed therein, and at the same time, a plurality of the wafers W are immersed into the rinsing liquid for 3 to 10 minutes for instance.

In this first rinsing step S4, an organic solvent can be employed as the rinsing liquid. Preferably, an organic solvent to be employed in this first rinsing step S4 may be substantially the same material as that to be employed in the aforementioned washing liquid. For example, if the washing liquid contains ethylene glycol as a protective agent and as an organic solvent, this ethylene glycol can be employed as a rinsing liquid in the first rinsing step S4.

When the first rinsing step S4 is performed in this manner, it is possible to prevent the composition of washing liquid (in particular, the ratio of water in the washing liquid) from being changed in the initial stage of the first rinsing step S4 and hence to prevent the corrosion of the metallic layer 43 that may be resulted from an insufficient formation of a protective film for protecting the metallic layer 43. However, if there is no possibility of such problems, this first rinsing step employing an organic solvent as a rinsing liquid may be omitted, and only the second rinsing step S5 may be performed as explained hereinafter.

In the second rinsing step S5, pure water is employed as a rinsing liquid. Namely, in this second rinsing step, the organic solvent-rinsing liquid and, if any, the washing liquid remaining on the target surface of the wafer W are sufficiently replaced by pure water.

Then, for the purpose of removing the pure water from the target surface of the wafer W, the drying step S6 is performed. This drying step is performed, as in the case of the removing step S2, by fixing the wafer W through suction onto the surface of the rotary table 21 and rotating the rotary table 21 at a high speed, as shown in FIG. 2B. As a result, the pure water adhered onto the wafer W flies away with the effect of centrifugal force, thereby drying the target surface of the wafer W.

As explained above, according to the polishing-cleaning method shown in FIG. 1, the residues 44 remaining on the target surface of the wafer W after the polishing step S1 are removed by the etching effect of the washing liquid employed in the washing step S3. In this washing step, the metallic layer 43 is covered with a protective film derived from the protective agent, so that the metallic layer 43 is prevented from being excessively etched or corroded in preference to the silicon oxide film 42.

Furthermore, since the water-removing step S2 is performed prior to the washing step S3, there is little possibility that the washing liquid can be diluted by the water adhered onto the wafer W. Therefore, it is possible to prevent the composition of the washing liquid, in particular the content of water in the washing liquid, from being altered, and hence to prevent the corrosion of the metallic layer 43 that may be resulted from an insufficient formation of a protective film for protecting the metallic layer 43.

If the content of water in the washing liquid is changed, the process of forming the protective film on the surface of the metallic layer as well as the function of the etchant to be provided by a fluorine compound are changed. For example, the etching rates of the silicon oxide film 42 and the metallic layer 43 that can be effected by the washing liquid may be greatly changed, thereby inviting a cause for deteriorating the features of the target surface. Furthermore, such a change in content of water in the washing liquid would become a cause for fluctuating the treating conditions of the wafer W from lot to lot.

However, if there is no possibility of such problems, this water-removing step S2 may be omitted, and the washing step S3 may be performed immediately after the CMP step S1.

The water-removing step S2 may be performed by washing the wafer W with an organic solvent so as to remove water from the target surface of the wafer W, in alternative to rotating the wafer W at a high speed. If the water-removing step S2 is performed by making use of an organic solvent as mentioned above, the same organic solvent as used in the washing liquid should preferably be employed. For example, if the washing liquid contains ethylene glycol as a protective agent and as an organic solvent, this ethylene glycol can be employed as a treating liquid in the water-removing step S2.

By performing the water-removing step S2 in this manner, it is also possible to prevent the composition of washing liquid (in particular, the ratio of water in the washing liquid) from being changed in the initial stage of the washing step S3 and hence to prevent the corrosion of the metallic layer 43 that may be resulted from an insufficient formation of a protective film for protecting the metallic layer 43.

(Experiment)

A comparative test was performed using a washing liquid of an example according to the present invention and a washing liquid of a comparative example to compare the washing property of these washing liquids.

In each of the example and the comparative example, the procedures shown in FIG. 1 for treating the target surface of the wafer W were followed in order to bury a contact hole formed in a silicon oxide film with a tungsten metal layer as shown in FIGS. 3A to 3C. However, the compositions of the washing liquids employed in the washing step S3 in the example and the comparative example were different from each other as explained below.

Namely, in the example, the washing liquid employed was a mixed solution comprising a BHF (as a fluorine compound) which was formed of a mixture of a 40% aqueous solution of $NH_4F$ and a 50% aqueous solution of HF, the mixing ratio thereof being 50:1 (by volume), and ethylene glycol (as a protective agent functioning also as a solvent), the mixing ratio between the BHF and ethylene glycol being 1:4 (by volume). On the other hand, the washing liquid employed in the comparative example was a solution of $(NH_2OH)_2H_2SO_4$, which is commonly employed in a surface treatment after sputtering.

The target surface of the wafer W after the washing step in each of the example and the comparative example was then observed by making use of an SEM (scanning electron microscope). As a result, no residue was recognized on the target surface of the wafer W after the washing step in the case of this example, thus confirming the effectiveness of the washing liquid of this example in cleaning the target surface of the wafer W after the polishing step. On the other hand, a fairly large amount of residues were recognized as being left remained on the target surface of the wafer W after the washing step in the case of the comparative example.

Note that, in the aforementioned embodiment, the wafer W is immersed in the washing liquid in performing the washing step. However, this washing step can be performed by spraying the wafer W with the washing liquid. The wafer W may not be washed as a lot, but may be washed one by one. This invention is not limited to the treatment of semiconductor wafer, but is also applicable to other kinds of substrate such as an LCD (liquid crystal display) substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of polishing and cleaning a target surface of a substrate provided thereon with a first layer consisting essentially of a silicon oxide and having a hole formed therein, and a second layer consisting essentially of a wiring material and covering said first layer while filling said hole, said method comprising:

a polishing step of polishing flatly said second layer by means of chemical mechanical polishing using a polishing liquid while holding said substrate on a rotatable holder until said first layer and part of said second layer filling said hole are exposed;

a removing step of removing said polishing liquid from said target surface after said polishing step, by rotating said substrate to dry said target surface while holding said substrate on a rotary table which is not said rotatable holder;

a washing step of washing said target surface with a washing liquid so as to remove residues from said target surface after said removing step, said washing liquid comprising a fluorine compound for providing an etchant for said first layer and said second layer, and a protective agent which can be adhered onto a surface of a second layer so as to form a protective film, wherein a ratio between said fluorine compound and said protective agent being set such that etching rates of said first layer and said second layer to be effected by said washing liquid fall within ranges of from 0.5 nm/min to 5 nm/min and from 0.5 nm/min to 6 nm/min, respectively, and a ratio between these etching rates falls within a range of from 2:1 to 1:3;

a rinsing step of rinsing the target surface with a rinsing solution after said washing step; and a drying step of drying said target surface after said rinsing step.

2. The method according to claim 1, wherein said protective agent comprises an organic compound having a hydroxyl group.

3. The method according to claim 2, wherein said protective agent comprises an organic compound having two or more hydroxyl groups in its molecule.

4. The method according to claim 1, wherein said protective agent comprises a nonionic surface active agent.

5. The method according to claim 1, wherein said protective agent comprises at least one compound selected from a group consisting of a polyhydric alcohol, ketone and ether.

6. The method according to claim 1, wherein said protective agent comprises an organic material, and said washing liquid comprises an organic solvent which is different from said organic material.

7. The method according to claim 1, wherein said rinsing solution is formed substantially of pure water.

8. The method according to claim 7, comprising a pre-rinsing step of rinsing said target surface with an organic solvent between said washing step and said rinsing step.

9. The method according to claim 8, wherein said washing liquid contains an organic solvent, and said organic solvent used in said pre-rinsing step is formed of substantially the same material as said organic solvent contained in said washing liquid.

10. The method according to claim 1, wherein said drying step comprises a step of rotating said substrate to dry said target surface while holding said substrate on said rotary table.

* * * * *